United States Patent
Iwasaki et al.

(10) Patent No.: US 7,719,390 B2
(45) Date of Patent: May 18, 2010

(54) DUAL MODE PIEZOELECTRIC FILTER, METHOD OF MANUFACTURING THE SAME, HIGH FREQUENCY CIRCUIT COMPONENT AND COMMUNICATION DEVICE USING THE SAME

(75) Inventors: Tomohiro Iwasaki, Osaka (JP); Hiroshi Nakatsuka, Osaka (JP); Keiji Onishi, Osaka (JP); Takehiko Yamakawa, Osaka (JP); Tomohide Kamiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 342 days.

(21) Appl. No.: 12/019,330

(22) Filed: Jan. 24, 2008

(65) Prior Publication Data

US 2008/0180193 A1 Jul. 31, 2008

(30) Foreign Application Priority Data

Jan. 25, 2007 (JP) ............................. 2007-015201

(51) Int. Cl.
*H03H 9/54* (2006.01)
*H03H 9/205* (2006.01)
*H03H 9/70* (2006.01)
*H03H 3/02* (2006.01)

(52) U.S. Cl. ...................... 333/189; 310/312; 333/133; 29/25.35

(58) Field of Classification Search ......... 333/187–189, 333/133; 310/312; 29/25.35
See application file for complete search history.

(56) References Cited

U.S. PATENT DOCUMENTS 3,573,672 A * 4/1971 Fair et al. .................. 333/191
3,866,155 A * 2/1975 Kobayashi et al. .......... 333/191
4,093,914 A * 6/1978 Peppiatt et al. ............. 324/727
4,833,430 A * 5/1989 Roberts et al. .............. 333/191
4,839,618 A * 6/1989 Roberts et al. .............. 333/191
5,495,135 A * 2/1996 Zimnicki et al. ............ 310/312
6,492,759 B1 * 12/2002 Watanabe ................... 310/320
2002/0190814 A1 12/2002 Yamada et al.
2005/0012569 A1 1/2005 Sasaki

FOREIGN PATENT DOCUMENTS

| JP | 10-163804 | 6/1998 |
| JP | 2004-147246 | 5/2004 |
| JP | 2005-269241 | 9/2005 |
| WO | WO 02/093549 | 11/2002 |

* cited by examiner

*Primary Examiner*—Barbara Summons
(74) *Attorney, Agent, or Firm*—Hamre, Schumann, Mueller & Larson, P.C.

(57) ABSTRACT

A dual mode piezoelectric filter includes a piezoelectric material layer composed of a piezoelectric thin film of the high-cut type formed on a substrate, a first electrode and a second electrode formed on one of the major surfaces of the piezoelectric material layer with a gap provided therebetween, a third electrode formed on the other major surface of the piezoelectric material layer opposite to the first electrode, the second electrode, and the gap, and an interelectrode mass load element formed in the gap or at a position opposite to the gap on a surface of the piezoelectric material layer. The relationships $(\rho_1 \times h_1) \leq (\rho_a \times h_a)$ and $(\rho_2 \times h_2) \leq (\rho_a \times h_a)$ are satisfied, where $h_1$ is the thickness and $\rho_1$ is the density of the first electrode, $h_2$ is the thickness and $\rho_2$ is the density of the second electrode, and $h_a$ is the thickness and $\rho_a$ is the density of the interelectrode mass load element. A filter characteristic with a smooth passband and low losses is obtained.

24 Claims, 14 Drawing Sheets

DUAL MODE PIEZOELECTRIC FILTER, METHOD OF MANUFACTURING THE SAME, HIGH FREQUENCY CIRCUIT COMPONENT AND COMMUNICATION DEVICE USING THE SAME

BACKGROUND OF THE INVENTION

1. Field of the Invention

The present invention relates to dual mode piezoelectric filters and, more specifically, relates to a filter construction that improves the degree of coupling between the two modes and reduces losses within the passband.

2. Description of Related Art

Conventional filters used in mobile phones and other wireless communication devices include dielectric filters, laminated filters, acoustic wave filters, and the like. Among acoustic wave filters, well-known types include quartz crystal filters (MCF: monolithic crystal filters), which utilize multiple bulk wave modes, surface acoustic wave filters (SAW filters), etc. However, recent years have seen increased demand for miniaturization, upgraded performance characteristics, and higher frequencies, and piezoelectric filters (FBAR filters), which utilize bulk waves in piezoelectric thin films, have been developed as devices satisfying those requirements. Moreover, multiple-mode piezoelectric filters, which are implemented by multiplexing multiple modes, have been proposed in the field of piezoelectric filters.

A conventional configuration that utilizes multiple modes in the above-mentioned MCFs has been disclosed in JP H10-163804A. FIG. 18A is a schematic plan view illustrating the MCF configuration disclosed in JP H10-163804A, and FIG. 18B is a sectional view. The MCF has a dual-mode filter construction wherein a piezoelectric substrate 51 is used to form an integral vibratory portion 52, which is an ultra-thin strip, and a surrounding thick annular enclosure portion 53 supporting the vibratory portion 52, and, in addition, two electrodes 54a, 54b with a width of W and a length of L are arranged, with a gap "g" provided therebetween, on top of the piezoelectric substrate 51, and a full-surface electrode 55 adhered to the rear side. Lead electrodes 56 extend from the electrodes 54a, 54b toward the surrounding thick edge portion, with bonding pad electrodes 57 provided on the edge portion. In the recessed portion, the full-surface electrode 55 serves double duty as a lead electrode.

Acoustic resonance is generated, for instance, by using electrode 54a as an input electrode and electrode 54b as an output electrode and applying potentials between, respectively, the electrode 54a and the fill-surface electrode 55, and between the electrode 54b and the full-surface electrode 55. The filter is formed by coupling two modes, i.e. a primary mode and a secondary mode, which are generated as a result of the acoustic resonance. Moreover, if the central dimension of the vibratory portion is designated as $A=(A1+A2)/2$ and its dimension in a direction normal thereto is designated as B, then, in order to suppress the spurious effects generated when the electrode film thickness is reduced and the passband of the filter is expanded, $A/(2W+g)$ is set to between 1.4 and 1.8 and the B/L ratio is set to a range of from 1.3 to 1.7.

Moreover, another conventional configuration utilizing multiple modes in the above-mentioned MCFs has been disclosed in JP 2005-269241A. FIG. 19 is a cross-sectional view showing the MCF configuration disclosed in JP 2005-269241A. This MCF is a dual mode filter formed by arranging first and second electrodes 62, 63 on one of the major surfaces of a piezoelectric substrate 61, with a predetermined gap provided therebetween, and, at the same time, placing a third and fourth electrodes 64, 65 on the other major surface opposite to the first and second electrodes 62, 63. Although in the conventional configurations the electrode on one of the major surfaces was a full-surface electrode, the CI value (equivalent resistance at resonance) of the symmetric mode deteriorated beyond that of the anti-resonance mode and the yield declined, as a result of which the deterioration had to be suppressed by adhering a metal film 66, which was sufficiently large in comparison with said two electrodes 62, 63, on top of the two electrodes 62, 63 on one of the major surfaces of the piezoelectric substrate 61.

Moreover, a configuration of a dual mode piezoelectric filter, in which aluminum nitride (AlN) was used as the piezoelectric film and the fundamental wave of thickness-longitudinal vibration was used as the predominant vibration, was disclosed in JP2004-147246A. FIG. 20 is a cross-sectional view illustrating the dual mode piezoelectric filter configuration disclosed in JP 2004-147246A. In this dual mode piezoelectric filter, a structure obtained by forming an input electrode 81 and an output electrode 82 on a piezoelectric plate 71 made of aluminum nitride is supported on a supporting substrate 86 made of silicon. A grounding electrode 83 and a nitride silicon film 84 are interposed between the supporting substrate 86 and the piezoelectric plate 71, with a silicon oxide film 85 formed on a major surface of the piezoelectric plate 71. This construction generates an s_0 mode, i.e. a symmetric mode, and an a_0 mode, i.e. a diagonal symmetric mode, thereby producing a band-pass filter.

Moreover, because this is a layered construction, in which dielectric films of approximately the same thickness are provided on both major surfaces of the piezoelectric plate 71, and because the resonant frequencies of the two vibration modes are stable characteristics, it can yield a filter characteristic with a stable bandwidth, etc.

Next, explanations are provided regarding the characteristics of an exemplary conventional dual mode piezoelectric filter, in which aluminum nitride (AlN) is used for the piezoelectric thin film and the fundamental wave of thickness-longitudinal vibration is used as the predominant vibration. FIG. 21(a) illustrates the construction of an exemplary conventional dual mode piezoelectric filter utilizing an AlN film and the fundamental wave of thickness-longitudinal vibration as the predominant vibration, and (b) illustrates the distribution of the two generated vibration modes (the symmetric mode and diagonal symmetric mode).

The dual mode piezoelectric filter 90 includes a bottom electrode 94 formed on the top face of the substrate 95, a piezoelectric thin film 91 made of AlN formed on the bottom electrode 94, and two top electrodes 92, 93 formed on the piezoelectric thin film 91. Furthermore, a cavity portion 96 is formed in the substrate 95 so as to cover the area of the two top electrodes 92, 93.

A first vibratory portion is composed of the top electrode 92, a portion of the bottom electrode 94 that lies opposite to the top electrode 92, and a portion of the piezoelectric thin film 91 interposed therebetween. A second vibratory portion is composed of the top electrode 93, a portion of the bottom electrode 94 that lies opposite to the top electrode 93, and a portion of the piezoelectric thin film 91 interposed therebetween. The two vibratory portions are separated by providing a gap between the respective top electrodes 92, 93. Furthermore, with the vibration in the two vibratory portions ensured by the presence of the common cavity portion, the construction generates two vibration modes, i.e. a symmetric mode and a diagonal symmetric mode, as shown in FIG. 21(b).

Furthermore, FIGS. 22A to 22C illustrate the results of analysis conducted in case of the exemplary conventional dual mode piezoelectric filter shown in FIG. 21. FIG. 22A, in which planar-direction wavenumber is plotted along the abscissa and frequency is plotted along the ordinate, shows wavenumber distributions in the planar direction at various frequencies. The center of the abscissa is 0, with the right side showing real wavenumbers and the left side showing imaginary wavenumbers. Since there is no propagation in the planar direction at the frequency at which the wavenumber is 0, it indicates the resonant frequency of thickness-longitudinal vibration. Moreover, the figure shows that there is active propagation in the planar direction at frequencies, at which the wavenumber is real, and propagation attenuates at frequencies, at which the wavenumber is imaginary. This curve is commonly called a dispersion curve.

Furthermore, the curve is said to be of the high-cut type when the wavenumber is imaginary in the high frequency area, and of the low-cut type when the wavenumber is imaginary in the low frequency area. Piezoelectric materials of the high-cut type include aluminum nitride (AlN), PZT, etc., and piezoelectric materials of the low-cut type include ZnO, quartz, etc. Moreover, the choice between the high-cut type and low-cut type can be controlled by changing the direction of polarization of the piezoelectric thin film. Furthermore, FIG. 22B, in which frequency is plotted along the abscissa and the imaginary part of admittance is plotted along the ordinate, illustrates the respective admittance characteristics T0, S0 of the symmetric mode and diagonal symmetric mode shown in FIG. 21. FIG. 22C, in which frequency is plotted along the abscissa and insertion losses are plotted along the ordinate, illustrates the filter characteristic. The insertion losses are shown such that the top edge is 0, with the losses increasing towards the bottom.

In FIG. 22A, C1 shows a dispersion curve of the first vibratory portion and second vibratory portion, and C2 shows a dispersion curve obtained for the piezoelectric thin film 91 and bottom electrode 94 alone, without the top electrodes 92, 93. Both C1 and C2 show high-cut type curves. Here, when thickness-longitudinal vibration is the predominant vibration, the resonant frequency depends on the thickness and density of each layer, with the resonant frequency shifting to a lower range when the product of thickness×density is larger. This phenomenon is commonly referred to as the "mass loading effect", with C1 shifting to a lower range commensurately with the magnitude of the mass loading effects of the top electrodes 92, 93. At such time, the characteristic of C2 exhibits real wavenumbers in the vicinity of the resonant frequency of C1, i.e. in the vicinity of the frequency, at which the wavenumber in the planar direction reaches 0. Accordingly, vibration excited in the first vibratory portion or in the second vibratory portion actively propagates to areas free of the top electrodes and ends up leaking outside in the planar direction. As a result, as shown in FIG. 22B, the characteristics of the two vibration modes deteriorate, and, furthermore, as shown in FIG. 22C, the filter characteristic ends up exhibiting significant insertion losses.

Next, with reference to FIG. 23, explanations will be provided regarding another configuration and characteristics of an exemplary conventional dual mode piezoelectric filter obtained when aluminum nitride (AlN) is used for the piezoelectric thin film and the fundamental wave of thickness-longitudinal vibration is used as the predominant vibration. FIG. 23(a) shows the construction of the dual mode piezoelectric filter, and FIG. 23(b) shows the distribution of the two generated vibration modes (symmetric mode, diagonal symmetric mode). The piezoelectric filter has an energy confinement-type configuration, which provides particular improvements in terms of vibration energy leakage, such as in the case of the piezoelectric filter shown in FIG. 21.

The dual mode piezoelectric filter 100 has a bottom electrode 94 formed on one of the surfaces of the substrate 95, a piezoelectric thin film 91 of AlN formed on the bottom electrode 94, and two top electrodes 92, 93 formed on the piezoelectric thin film 91. A cavity portion 96 is formed in the substrate 95 so as to cover the area of the two top electrodes 92, 93. Furthermore, mass load elements 97a, 97b are provided on the outside and in the planar direction of the top electrodes 92, 93. It should be noted that, in this specification, the mass load elements are defined as elements producing the above-described mass loading effect.

Here, the density and the thickness of the mass load elements 97a, 97b is set such that (ρ1×h1)<(ρt×ht) and (ρ2×h2)<(ρt×ht), wherein h1 is the thickness and ρ1 is the density of the top electrode 92, h2 is the thickness and ρ2 is the density of the top electrode 93, and ht is the thickness and ρt is the density of the mass load elements 97a, 97b.

A first vibratory portion is composed of the top electrode 92, a portion of the bottom electrode 94 that lies opposite to the top electrode 92, and a portion of the piezoelectric thin film 91 interposed therebetween, and a second vibratory portion is composed of the top electrode 93, a portion of the bottom electrode 94 that lies opposite to the top electrode 93, and a portion of the piezoelectric thin film 91 interposed therebetween. The two vibratory portions are separated by providing a gap between the respective top electrodes 92, 93. In addition, vibration in the two vibratory portions is ensured by the presence of the common cavity portion 96 and, furthermore, vibration energy is confined to the first vibratory portion and second vibratory portion by providing the mass load elements 97a, 97b, thereby generating the two vibration modes shown in FIG. 23, i.e. the symmetric mode and diagonal symmetric mode.

FIGS. 24A to 24C illustrate the results of analysis conducted for the exemplary conventional dual mode piezoelectric filter shown in FIG. 23. FIG. 24A, in the same manner as FIG. 22A, shows wavenumber distributions in the planar direction at various frequencies, wherein a wavenumber in the planar direction is plotted along the abscissa and frequency is plotted along the ordinate. In the same manner as FIG. 22B, FIG. 24B, in which frequency is plotted along the abscissa and the imaginary part of admittance is plotted along the ordinate, illustrates the respective admittance characteristics T1, S1 of the symmetric mode and diagonal symmetric mode shown in FIG. 23. In the same manner as FIG. 22C, FIG. 24C, in which frequency is plotted along the abscissa and insertion losses are plotted long the ordinate, shows the filter characteristic.

In FIG. 24A, C1 shows a dispersion curve of the first vibratory portion and second vibratory portion. C2 shows a dispersion curve obtained for the piezoelectric thin film 91 and bottom electrode 94 alone, without the top electrodes 92, 93, i.e. for the region between the top electrodes 92, 93. C3 shows a dispersion curve obtained for the regions, in which the mass load elements 97a, 97b are formed. C1, C2, and C3 all show high-cut type curves. Here, the increased density and thickness of the mass load elements 97a, 97b causes C3 to shift to a lower range in comparison with C1. In other words, since the characteristic of C3 exhibits imaginary wavenumbers in the vicinity of the resonant frequency of C1, the propagation of vibrations excited in the first vibratory portion or second vibratory portion attenuates in the region, in which the mass load elements 97a, 97b are formed, and the outward leakage in the planar direction is reduced. As a result, as shown in FIG. 24B, the characteristics of the two vibration modes are improved, and, furthermore, as shown in FIG. 24C, the filter characteristic is improved as well.

The construction illustrated in FIG. 23 reduces the specific vibration energy leakage that occurs when using high-cut type piezoelectric thin films and improves the filter characteristic. However, it is difficult to use because, as shown in FIG. 24C, the curve is not smooth within the passband. The reason is that in the construction of FIG. 23, the resonant frequency ftr of the symmetric mode T1 and the anti-resonant frequency fsa of the diagonal symmetric mode S1 are set far apart, as a result of which the sign becomes the same between these frequencies, while lossless passage is made possible by setting the admittances of the symmetric mode T1 and diagonal symmetric mode S1 shown in FIG. 24B so as to have opposite signs in the desired frequency band.

SUMMARY OF THE INVENTION

It is an object of the present invention to provide a dual mode piezoelectric filter exhibiting low losses and a smooth characteristic within the passband.

A first configuration of the dual mode piezoelectric filter of the present invention includes a piezoelectric material layer composed of a piezoelectric thin film of the high-cut type formed on a substrate, a first electrode and a second electrode formed on one of the major surfaces of the piezoelectric material layer with a gap provided therebetween, and a third electrode formed on the other major surface of the piezoelectric material layer opposite to the first electrode, the second electrode, and the gap. In order to solve the above-mentioned problem, an interelectrode mass load element further is formed in the gap or at a position opposite to the gap on a surface of the piezoelectric material layer and the relationships $(\rho 1 \times h1) \leqq (\rho a \times ha)$ and $(\rho 2 \times h2) \leqq (\rho a \times ha)$ are satisfied, where $\rho 1$ is the density and $h1$ is the thickness of the first electrode, $\rho 2$ is the density and $h2$ is the thickness of the second electrode, and $\rho a$ is the density and $ha$ is the thickness of the interelectrode mass load element.

A second configuration of the dual mode piezoelectric filter of the present invention includes a piezoelectric material layer composed of a piezoelectric thin film of the high-cut type formed on a substrate, a first electrode and a second electrode formed on one of the major surfaces of the piezoelectric material layer with a first gap provided therebetween, and a fourth electrode and a fifth electrode formed on the other major surface of the piezoelectric material layer with a second gap provided therebetween. The first electrode and fourth electrode are arranged opposite to each other with the piezoelectric material layer interposed therebetween, the second electrode and fifth electrode are arranged opposite to each other with the piezoelectric material layer interposed therebetween, and the first gap and second gap are arranged opposite to each other with the piezoelectric material layer interposed therebetween. In order to solve the above-mentioned problem, an interelectrode mass load element further is formed in the first gap or the second gap and the relationships $(\rho 1 \times h1 + \rho 4 \times h4) \leqq (\rho a \times ha)$ and $(\rho 2 \times h2 + \rho 5 \times h5) \leqq (\rho a \times ha)$ are satisfied, where $\rho 1$ is the density and $h1$ is the thickness of the first electrode, $\rho 2$ is the density and $h2$ is the thickness of the second electrode, $\rho 4$ is the density and $h4$ is the thickness of the fourth electrode, $\rho 5$ is the density and $h5$ is the thickness of the fifth electrode, and $\rho a$ is the density and $ha$ is the thickness of the interelectrode mass load element.

A method of manufacturing a dual mode piezoelectric filter of the present invention includes the steps of forming a first electrode and a second electrode on one of the major surfaces of a piezoelectric material layer composed of a high-cut type piezoelectric thin film with a gap provided therebetween, forming a third electrode on the other major surface of the piezoelectric material layer opposite to at least the first electrode and the second electrode, and forming an interelectrode mass load element in the gap or at a position opposite to the gap on a surface of the piezoelectric material layer. The values are set so as to satisfy the relationships $(\rho 1 \times h1) \leqq (\rho a \times ha)$ and $(\rho 2 \times h2) \leqq (\rho a \times ha)$, where $\rho 1$ is the density and $h1$ is the thickness of the first electrode, $\rho 2$ is the density and $h2$ is the thickness of the second electrode, and $\rho a$ is the density and $ha$ is the thickness of the interelectrode mass load element.

According to the dual mode piezoelectric filter of the configuration described above, it is made possible to shift the resonant frequency of a third vibratory portion, which is arranged between a first vibratory portion and a second vibratory portion by providing an interelectrode mass load element, to a lower range with respect to the resonant frequencies of the first vibratory portion formed with the first and third electrodes and a portion of the piezoelectric thin film interposed therebetween and the second vibratory portion formed with the second and third electrodes and another portion of the piezoelectric thin film interposed therebetween.

As a result, the resonant frequency of the symmetric mode and anti-resonant frequency of the diagonal symmetric mode practically can be made equal, or, alternatively, the anti-resonant frequency of the diagonal symmetric mode can be made greater than the resonant frequency of the symmetric mode, thereby making it possible to provide a dual mode piezoelectric filter exhibiting low losses and a smooth passband.

DETAILED DESCRIPTION OF THE INVENTION

Figure 1:
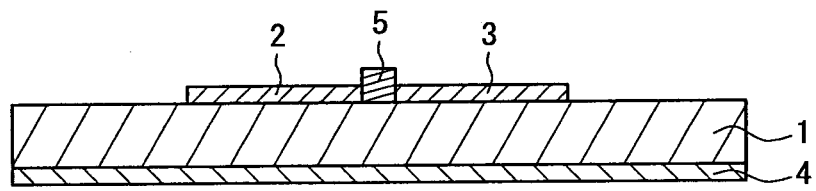
FIG. 1 is a cross-sectional view illustrating an exemplary construction of a resonant portion of a dual mode piezoelectric filter according to a first embodiment of the present invention.

Based on the configuration described above, the present invention can assume the various configurations described below.

In the first configuration of the dual mode piezoelectric filter of the present invention, the interelectrode mass load element can be formed on either one of the two major surfaces of the third electrode opposite to the gap so as to be disposed at the position opposite to the gap.

Furthermore, in the first configuration of the dual mode piezoelectric filter of the present invention, it is preferable that a resonant frequency fr3 is made lower than each of resonant frequencies fr1 and fr2, where fr1 is the resonant frequency of a first vibratory region composed of the first electrode, third electrode, and piezoelectric material layer, fr2 is the resonant frequency of a second vibratory region composed of the second electrode, third electrode, and piezoelectric material layer, and fr3 is the resonant frequency of a third vibratory region composed of the interelectrode mass load element, third electrode, and piezoelectric material layer.

In the second configuration of the dual mode piezoelectric filter, it is preferable that fr3 is lower than fr1 and fr2, where fr1 is the resonant frequency of a first vibratory region composed of the first electrode, fourth electrode, and piezoelectric material, fr2 is the resonant frequency of a second vibratory region composed of the second electrode, fifth electrode, and piezoelectric material layer, and fr3 is the resonant frequency of a third vibratory region composed of the interelectrode mass load element and piezoelectric material layer.

Moreover, in the first or second configuration of the dual mode piezoelectric filter, it is preferable that the interelectrode mass load element includes a layer made of an insulating material, and the first electrode and second electrode, or the fourth electrode and fifth electrode, which have the interelectrode mass load element interposed therebetween, are electrically insulated by the layer of insulating material.

Furthermore, the interelectrode mass load element may be composed of a multilayer film including the insulating material and an electrically conductive material, and the electrically conductive material is insulated electrically from the first electrode and second electrode, or from the fourth electrode and fifth electrode by the insulating material.

Moreover, the insulating material preferably is based on silicon oxide ($SiO_2$), silicon nitride (SiN), aluminum nitride (AlN), hafnium oxide ($HfO_2$), or silicon (Si).

Moreover, it is preferable that a distance between the first electrode and the second electrode, which form the gap, is smaller than half of a wavelength $\lambda$ of vibration generated in the gap.

Moreover, it is preferable that a cavity portion, or an acoustic mirror layer obtained by alternately depositing a low acoustic impedance layer and a high acoustic impedance layer, is formed below the vibratory regions composed of the piezoelectric material layer, first electrode, second electrode, third electrode, and interelectrode mass load element.

Moreover, the high-cut type piezoelectric material layer preferably is based on aluminum nitride (AlN) or PZT.

Furthermore, it is preferable that on one of the major surfaces of the piezoelectric material layer, an external mass load element is formed outside a region of the first electrode and second electrode in a planar direction so as to enclose the first electrode and second electrode, and the relationships ($\rho 1 \times h1$) $\leq$ ($\rho t \times ht$) and ($\rho 2 \times h2$) $\leq$ ($\rho t \times ht$) are satisfied, where $\rho t$ is the density and ht is the thickness of the external mass load element.

Either one of the above dual mode piezoelectric filter configurations can be used to make a high frequency circuit component and, in addition, such a high frequency circuit component can be used to make a communication device.

Embodiments of the present invention are described below with reference to drawings.

Embodiment 1

Figure 2:
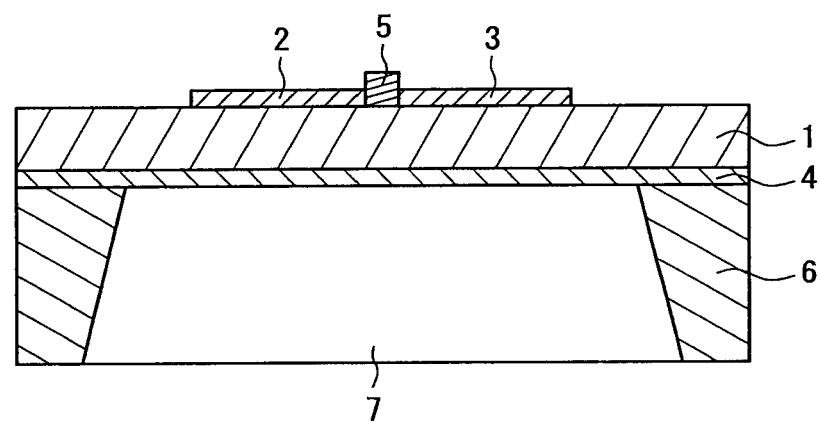
FIG. 2 is a cross-sectional view including a support structure used in the same dual mode piezoelectric filter.
Figure 3:
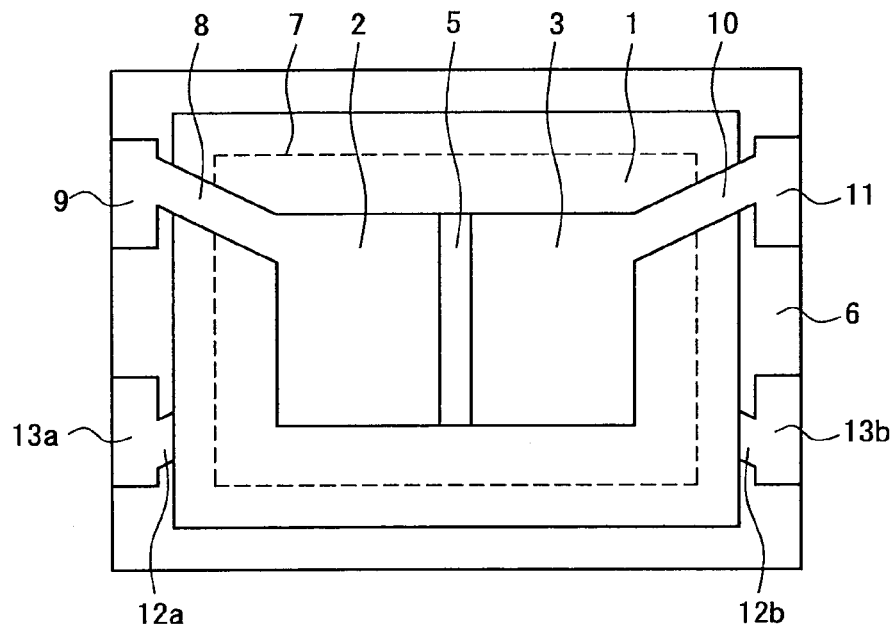
FIG. 3 is a top view of the same dual mode piezoelectric filter including the wiring.

FIG. 1 is a cross-sectional view illustrating an exemplary construction of a resonant portion of a dual mode piezoelectric filter according to a first embodiment of the present invention. FIG. 2 is a cross-sectional view showing a dual mode piezoelectric filter including a support structure used for the resonant portion illustrated in FIG. 1. FIG. 3 is a top view illustrating an exemplary construction of the dual mode piezoelectric filter illustrated in FIG. 1, including wiring.

As shown in FIG. 1, in the construction of the resonant portion of the dual mode piezoelectric filter of the present embodiment, a first electrode 2 and a second electrode 3, which serve as input/output electrodes, are formed on a piezoelectric material layer 1 composed of a piezoelectric thin film of the high-cut type, and a first mass load element 5, which constitutes an interelectrode mass load element, is formed in the gap between the first electrode 2 and second electrode 3. Furthermore, a third electrode 4, which serves as a grounding electrode, is formed opposite to the first electrode 2, second electrode 3, and first mass load element 5, with the piezoelectric material layer 1 interposed therebetween. Because the first electrode 2 and second electrode 3 work as input/output electrodes, the first mass load element 5 is formed from an insulating material in order to ensure the electric insulation of the first electrode 2 and second electrode 3.

In the present embodiment, a dual mode piezoelectric filter is formed as a result of the resonant portion of the above configuration being supported on a substrate 6, as shown in FIG. 2. A cavity portion 7 is formed in the substrate 6 so as to cover the first electrode 2, second electrode 3, and the region therebetween.

As shown only in FIG. 3, a readout wiring 8 and a terminal electrode 9 for the first electrode 2, and a readout wiring 10 and a terminal electrode 11 for the second electrode 3, are formed on the piezoelectric material layer 1. Moreover, lead-out wirings 12a, 12b and terminal electrodes 13a, 13b for the third electrode 4 are formed on the substrate 6.

The piezoelectric material layer 1 is formed from a piezoelectric material possessing dispersion characteristics of the high-cut type, such as, e.g. aluminum nitride (AlN) or PZT, etc. The first electrode 2, second electrode 3, and third electrode 4 are formed from an electrically conductive material such as, for instance, aluminum (Al), gold (Au), molybdenum (Mo), platinum (Pt), titanium (Ti), or tungsten (W). The first mass load element 5 is formed from an insulating material such as, for instance, silicon oxide ($SiO_2$), silicon nitride (SiN), aluminum nitride (AlN), hafnium oxide ($HFO_2$), or silicon (Si).

In accordance with the above configuration, a piezoelectric material possessing dispersion characteristics of the high-cut type is used for the piezoelectric material layer 1 and, in order to improve the coupling of the two generated vibration modes (symmetric mode and diagonal symmetric mode), the mass loading effect of the region between the first electrode 2 and second electrode 3 is enhanced in comparison with the mass loading effects of the two vibratory regions, in which the first electrode 2 and second electrode 3 are formed. In other words, a resonant frequency fr3 is made lower than each of the resonant frequencies fr1 and fr2, where fr1 is the resonant frequency of a first vibratory region composed of the first electrode 2, third electrode 4, and piezoelectric material layer 1, fr2 is the resonant frequency of a second vibratory region composed of the second electrode 3, third electrode 4, and piezoelectric material layer 1, and fr3 is the resonant frequency of a third vibratory region composed of the interelectrode mass load element 5, third electrode 4, and piezoelectric material layer 1.

The mass loading effect is determined by the formula ($\rho \times h$), wherein h is the thickness and $\rho$ is the density of the layers. Therefore, assuming that the film thickness of the opposed third electrode 4 is uniform in the regions in which the first electrode 2, second electrode 3, and first mass load element 5 are formed, the relationship between the value of ($\rho \times h$) of the first mass load element 5 and the value of ($\rho \times h$) of the first electrode 2, as well as the ($\rho \times h$) of the second electrode 3, is set accordingly. Namely, the following relationships are satisfied, wherein h1 is the thickness and $\rho 1$ is the density of the first electrode 2, h2 is the thickness and $\rho 2$ is the density of the second electrode 3, and ha is the thickness and $\rho a$ is the density of the first mass load element 5.

($\rho 1 \times h1$)$\leq$($\rho a \times ha$), and ($\rho 2 \times h2$)$\leq$($\rho a \times ha$).

This dual mode filter makes use of two vibration modes, i.e. a symmetric mode and a diagonal symmetric mode, whose predominant vibration is the fundamental wave of thickness-longitudinal vibration generated as a result of the application of voltage between the first electrode 2, second electrode 3, and third electrode 4. To ensure the vibration, there has to be a common vibration-ensuring portion. As shown in FIG. 2, a cavity portion 7 is formed in substrate 6, with the cavity portion 7 being adapted to cover the region in which the first electrode 2, second electrode 3, and first mass load element 5 are formed. Although sacrificial etching, etching from the rear side of the substrate using microfabrication techniques, and transfer processes, in which the piezoelectric thin film is adhered to another substrate, etc. can be used to form the cavity portion 7, the specific process that is selected has no practical influence on the effects of the present invention.

Figure 4:
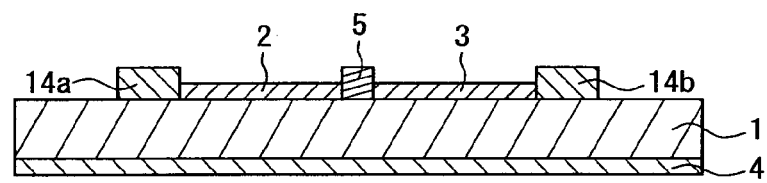
FIG. 4 is a cross-sectional view illustrating a configuration implementing energy confinement in the same dual mode piezoelectric filter.

Moreover, as shown in FIG. 4, it is preferable that, furthermore, second mass load elements 14a, 14b be formed on the outside and in the planar direction of the first electrode 2 and second electrode 3 on the piezoelectric material layer 1, so as to serve as external mass load elements, and it is desirable that the two generated vibration modes be confined to the region in which the desired first electrode 2, second electrode 3, and first mass load element 5 are formed.

In such a configuration, the following relationships should be satisfied, wherein $\rho t$ is the density and ht is the thickness of the second mass load elements 14a and 14b.

($\rho 1 \times h1$)$\leq$($\rho t \times ht$), and ($\rho 2 \times h2$)$\leq$($\rho t \times ht$).

Figure 5A:
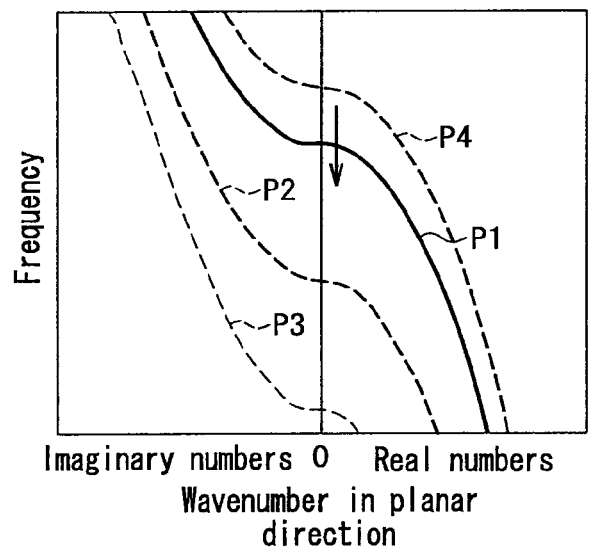
FIG. 5A is a diagram illustrating the dispersion characteristics of the vibratory portions used in the dual mode piezoelectric filter according to the first embodiment of the present invention.
Figure 5B:
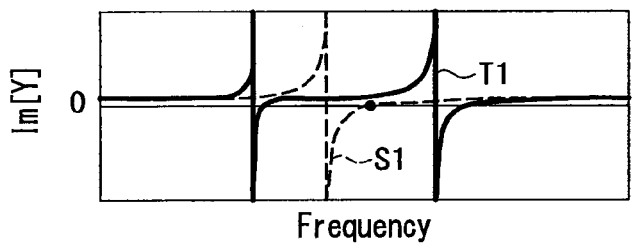
FIG. 5B is a diagram illustrating the admittance characteristics of the symmetric mode and diagonal symmetric mode in the conventional dual mode piezoelectric filter.
Figure 5C:
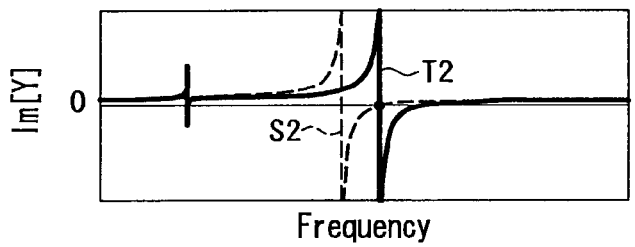
FIG. 5C is a diagram illustrating the admittance characteristics of the symmetric mode and diagonal symmetric mode in the dual mode piezoelectric filter according to a first embodiment of the present invention.
Figure 23:
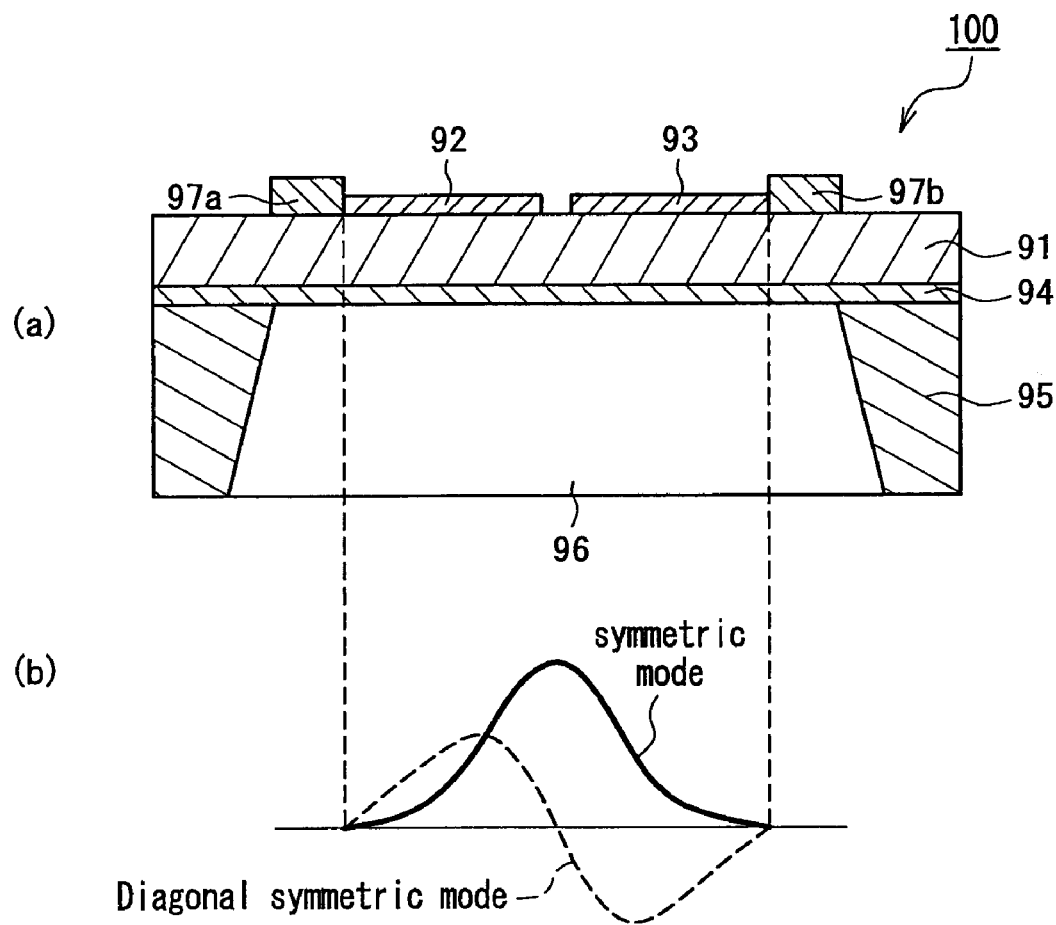
FIG. 23 is a diagram illustrating another configuration used for energy confinement and vibrational distribution of a conventional dual mode piezoelectric filter utilizing a piezoelectric thin film of the high-cut type.
Figure 24A:
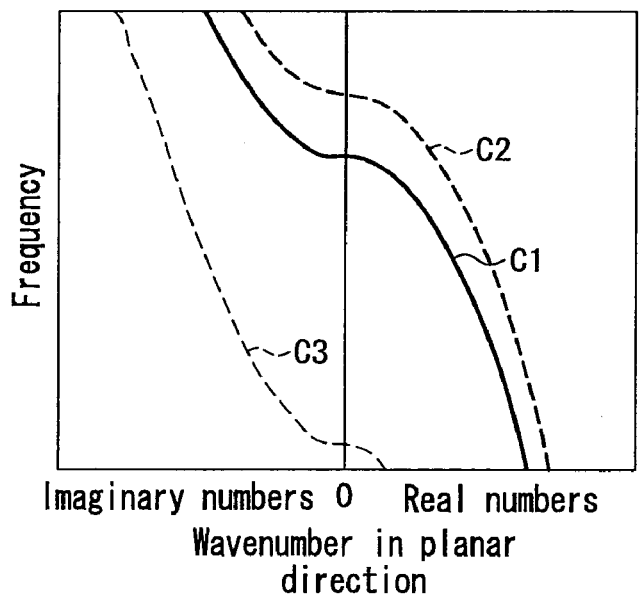
FIG. 24A is a diagram illustrating the dispersion characteristics of the vibratory portions in a conventional dual mode piezoelectric filter capable of energy confinement.
Figure 24B:
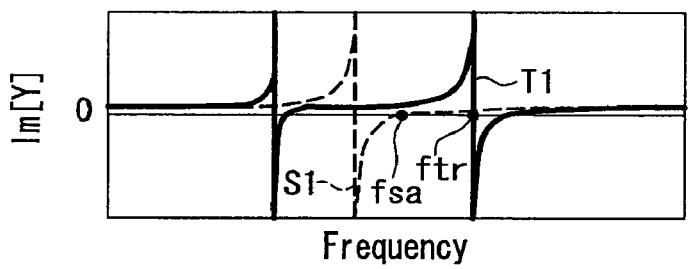
FIG. 24B is a diagram illustrating the admittance characteristics of the symmetric mode and diagonal symmetric mode in a conventional dual mode piezoelectric filter capable of energy confinement.
Figure 24C:
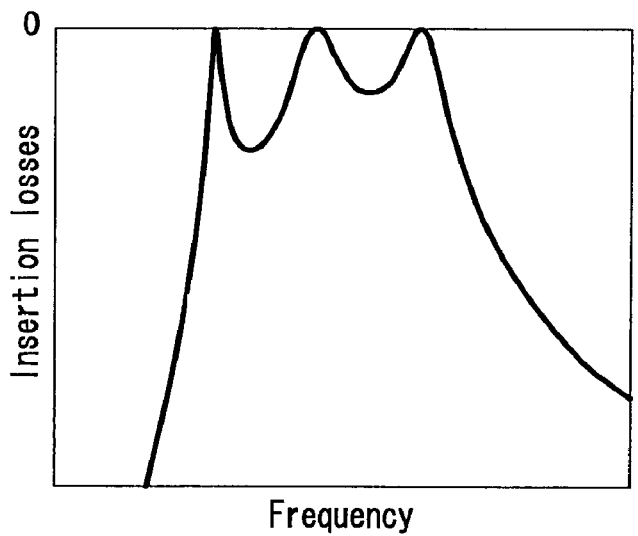
FIG. 24C is a diagram illustrating the filter characteristic of a conventional dual mode piezoelectric filter capable of energy confinement.

Here, explanations will be provided regarding the principle of operation of the dual mode piezoelectric filter of the present embodiment. FIGS. 5A to 5C provide a comparison between analytical results obtained for the dual mode piezoelectric filter according to the embodiment illustrated in FIG. 4 and the conventional confinement-type dual mode piezoelectric filter illustrated in FIG. 23. FIG. 5A shows wavenumber distributions in the planar direction at various frequencies, i.e. dispersion curves P1~P4, wherein wavenumbers in the planar direction are plotted along the abscissa and frequency is plotted along the ordinate. The center of the abscissa is 0, with the right side showing real wavenumbers and the left side showing imaginary wavenumbers. Accordingly, since there is no propagation in the planar direction at the frequency at which the wavenumber is 0, it indicates the resonant frequency of thickness-longitudinal vibration. Moreover, the figure shows that there is active propagation in the planar direction at frequencies, at which wavenumbers real, and propagation attenuates at frequencies, at which wavenumbers are imaginary. Furthermore, the curve is said to be of the high-cut type when the wavenumber is imaginary in the high frequency area, and of the low-cut type when the wavenumber is imaginary in the low frequency area.

In FIG. 5A, P1 shows the dispersion curve of the first vibratory portion, which is composed of the first electrode 2, third electrode 4, and piezoelectric material layer 1 interposed therebetween, and the second vibratory portion, which is composed of the second electrode 3, third electrode 4, and piezoelectric material layer 1 interposed therebetween. P2 shows the dispersion curve of the third vibratory portion composed of the first mass load element 5, third electrode 4, and the piezoelectric material layer 1, which is interposed therebetween. P3 shows the dispersion curve of the fourth vibratory portion composed of the second mass load elements 14a, 14b, third electrode 4, and piezoelectric material layer 1, which is interposed therebetween. Furthermore, P4 shows the distribution curve obtained in the absence of the first mass load element 5 in the third vibratory portion, i.e. when there is a gap between the first electrode and second electrode in the conventional dual mode piezoelectric filter illustrated in FIG. 23. All the dispersion curves P1~P4 are of the high-cut type. As can be seen, here, the mass loading effect produced by the placement of the first mass load element 5 causes P2 to shift to a lower range relative to P4 and, in addition, causes P2 to shift to a lower range relative to P1.

FIG. 5B and FIG. 5C, in which frequency is plotted along the abscissa and the imaginary part of admittance is plotted along the ordinate, show the admittance characteristic of the symmetric mode and the admittance characteristic of the diagonal symmetric mode. FIG. 5B illustrates the admittance characteristic T1 of the symmetric mode and the admittance characteristic S1 of the diagonal symmetric mode in a conventional dual mode piezoelectric filter. FIG. 5C illustrates the admittance characteristic T2 of the symmetric mode and the admittance characteristic S2 of the diagonal symmetric mode in the dual mode piezoelectric filter of the present embodiment illustrated in FIG. 4.

As shown in FIG. 5C, shifting the dispersion curve P2 of the region between the first electrode 2 and second electrode 3 to a lower range relative to P1, as shown above, makes it possible to draw the resonant frequency of the symmetric mode and anti-resonant frequency of the diagonal symmetric mode into closer proximity and cause them to practically coincide.

Figure 5D:
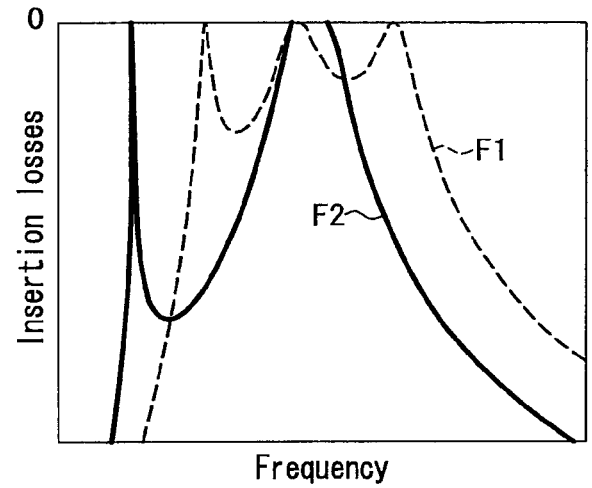
FIG. 5D is a diagram illustrating the filter characteristic of the same dual mode piezoelectric filter.

FIG. 5D, in which frequency is plotted along the abscissa and insertion losses are plotted long the ordinate, shows filter characteristics. In FIG. 5D, F1 shows the filter characteristic of a conventional dual mode piezoelectric filter. F2 shows the filter characteristic of the dual mode piezoelectric filter of the present embodiment illustrated in FIG. 4. As shown above, causing the resonant frequency of the symmetric mode and anti-resonant frequency of the diagonal symmetric mode to practically coincide makes it possible to implement a smooth characteristic exhibiting low losses and no ripple within the passband.

Figure 6:
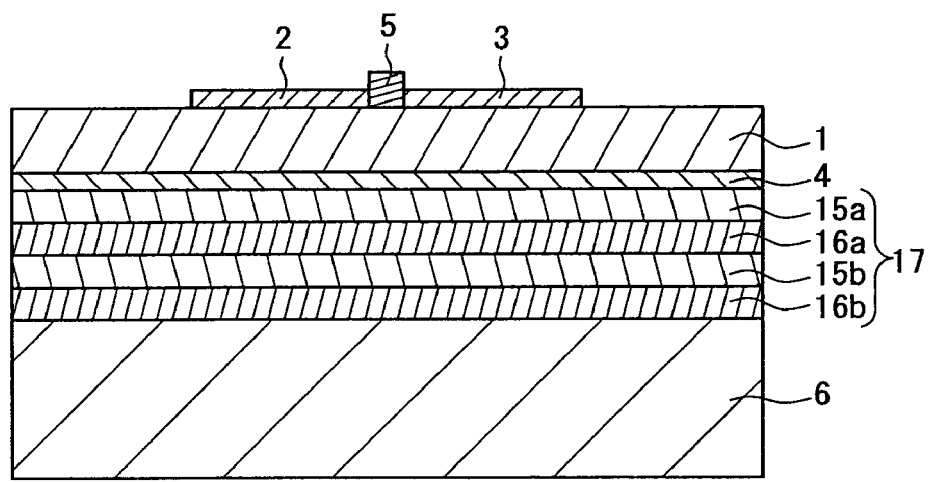
FIG. 6 is a cross-sectional view including another support structure used in the same dual mode piezoelectric filter.

It should be noted that while the above explanation assumes that the support structure of the dual mode piezoelectric filter has a construction wherein, in order to ensure vibration, the substrate 6 has a cavity portion 7, providing an acoustic mirror structure makes it possible to use a construction in which no cavity portion 7 is formed. In other words, as shown in FIG. 6, the support structure of the dual mode piezoelectric filter can be obtained by forming an acoustic mirror 17 on top of the substrate 6. As a result, a filter characteristic can be achieved that exhibits low losses and a smooth passband, in the same manner as in the above-described example. In such a construction, the acoustic mirror 17 is placed between the substrate 6 and third electrode 4. The acoustic mirror 17 is formed by alternately depositing high acoustic impedance layers 16a, 16b and low acoustic impedance layers 15a, 15b with a film thickness of ¼-wavelength calculated from the resonant frequency of thickness-longitudinal vibration.

Figure 7:
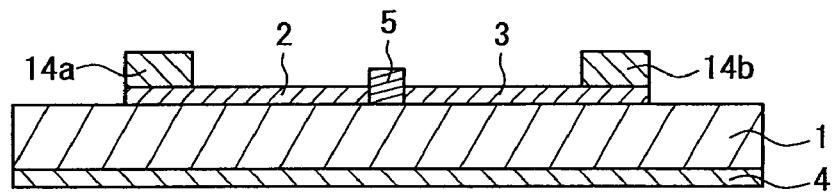
FIG. 7 is a cross-sectional view illustrating another configuration implementing energy confinement in the same dual mode piezoelectric filter.

Furthermore, the construction illustrated in FIG. 7 allows for second mass load elements 14a, 14b to be formed. Namely, second mass load elements 14a, 14b are arranged on the first electrode 2 and second electrode 3, in the outermost regions in the planar direction thereof. As a result of using this construction, in the region of the first electrode 2, in which the second mass load element 14a is arranged, the mass loading effect becomes larger in comparison with the region in which the second mass load element 14a is not present. Additionally, in the region of the second electrode 3, in which the second mass load element 14b is arranged, the mass loading effect becomes larger than in the region in which the second mass load element 14b is not present. As a result, in the same manner as in the above-described example, vibration energy can be confined to the desired first vibratory portion, second vibratory portion, or third vibratory portion, and furthermore, the effects provided by the first mass load element 5 make it possible to achieve a filter characteristic exhibiting low losses and a smooth passband.

Figure 8:
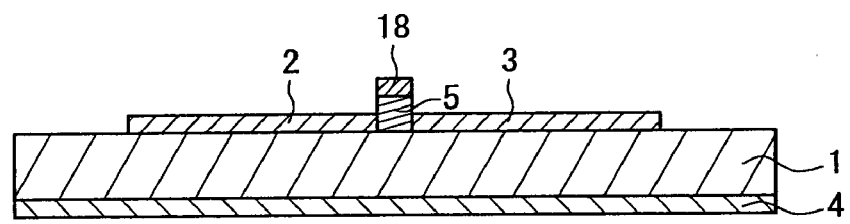
FIG. 8 is a cross-sectional view of an exemplary construction, in which the mass load element in the resonant portion of the same dual mode piezoelectric filter is composed of a multilayer film.
Figure 9:
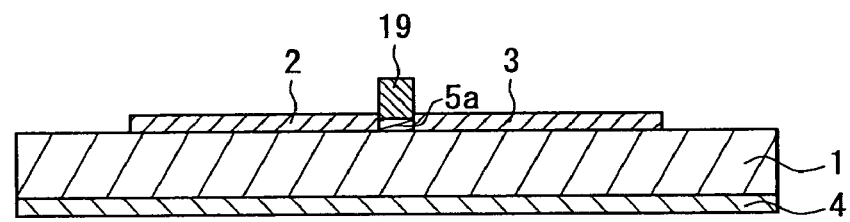
FIG. 9 is a cross-sectional view of another exemplary construction, in which the mass load element in the resonant portion of the same dual mode piezoelectric filter is composed of a multilayer film.

Moreover, the constructions shown in FIG. 8 and FIG. 9 may be multilayer structures including two layers obtained by forming, on the first mass load element 5, a third mass load element 18 made of an electrically conductive material or a fourth mass load element 19 made of an insulating material.

As shown in FIG. 8, the electrically conductive third mass load element 18 is electrically insulated from the first electrode 2 and second electrode 3 by making the film thickness of the first mass load element 5 greater than the first electrode 2 and second electrode 3. Furthermore, as shown in FIG. 9, since the fourth mass load element 19 is made of an insulating material, the first electrode 2 and second electrode 3 are electrically insulated even though the film thickness of the first mass load element 5a is smaller than the film thickness of the first electrode 2 and second electrode 3.

Here, if, as shown in FIG. 8, the third electrode 4 has the same film thickness in the vibratory portions 1 through 3, the value of the sum of ($\rho \times h$) of the first mass load element 5 and ($\rho \times h$) of the third mass load element 18 is set so as to be equal or greater than each of the value of ($\rho \times h$) of the first electrode 2 and ($\rho \times h$) of the second electrode 3. Moreover, if, as shown in FIG. 9, the third electrode 4 has the same film thickness in the vibratory portions 1 through 3, the value of the sum of ($\rho \times h$) of the first mass load element 5a and ($\rho \times h$) of the fourth mass load element 19 is set so as to be equal or greater than each of the value of ($\rho \times h$) of the first electrode 2 and ($\rho \times h$) of the second electrode 3. As a result, a filter characteristic can be achieved that exhibits low losses and a smooth passband, in the same manner as in the above-described example. Furthermore, if the density ρ of the third mass load element 18 and fourth mass load element 19 is made greater than the density of the first mass load element 5 or 5a, the overall film thickness can be reduced in comparison with the case wherein only the first mass load element 5 or 5a are used.

Embodiment 2

Figure 10:
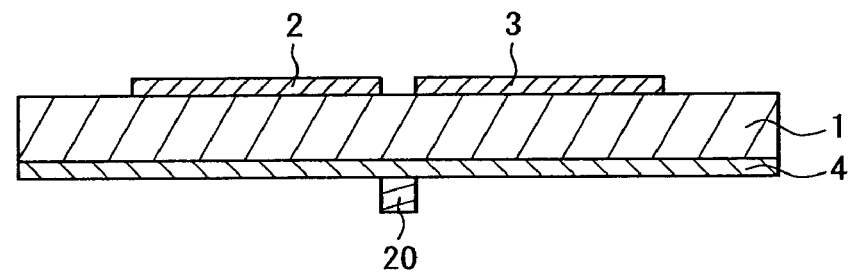
FIG. 10 is a cross-sectional view illustrating an exemplary construction of a resonant portion of a dual mode piezoelectric filter according to a second embodiment of the present invention.

FIG. 10 is a cross-sectional view illustrating an exemplary construction of a resonant portion of a dual mode piezoelectric filter according to a second embodiment of the present invention.

In this resonant portion, a first electrode 2 and a second electrode 3, which serve as input/output electrodes, are formed on top of a high-cut type piezoelectric material layer 1 with a gap provided therebetween, and a third electrode 4, which serves as a grounding electrode, is formed opposite to the first electrode 2, second electrode 3, and the gap between the first electrode 2 and second electrode 3, with the piezoelectric material layer 1 interposed therebetween. Furthermore, a fifth mass load element 20 is formed in a region that faces the gap, so as to be positioned opposite to the gap, with the piezoelectric material layer 1 and third electrode 4 interposed therebetween. Since the first electrode 2 and second electrode 3 are separated spatially in the planar direction, the first electrode 2 and second electrode 3 are electrically insulated. The fifth mass load element 20 is made of an insulating material.

In the same manner as the construction of the first embodiment illustrated in FIG. 2, the construction of the resonant portion illustrated in FIG. 10 is formed on a substrate, with a cavity portion formed in the substrate, thus constituting the dual mode piezoelectric filter of the present embodiment. Furthermore, in the same manner as in the construction of the first embodiment illustrated in FIG. 3, a leadout wiring and a terminal electrode used by the first electrode 2, as well as a leadout wiring and a terminal electrode used by the second electrode 3, are formed on top of the piezoelectric material layer 1 and, moreover, leadout wirings and terminal electrodes used by the third electrode 4 are formed on the substrate.

The first electrode 2, second electrode 3, and third electrode 4 are formed from an electrically conductive material such as, for instance, aluminum (Al), gold (Au), molybdenum (Mo), platinum (Pt), titanium (Ti), tungsten (W), etc. The fifth mass load element 20 is formed from an insulating material such as, for instance, silicon oxide ($SiO_2$), silicon nitride (SiN), aluminum nitride (AlN), hafnium oxide ($HfO_2$), silicon (Si), etc. The piezoelectric material layer 1 is formed from a piezoelectric material possessing dispersion characteristics of the high-cut type, such as, e.g. aluminum nitride (AlN), PZT, etc.

In the same manner as in the first embodiment, a piezoelectric material possessing dispersion characteristics of the high-cut type is used for the piezoelectric material layer 1 and, in order to improve the coupling of the two generated vibration modes (symmetric mode and diagonal symmetric mode), the mass loading effect of the region between the first electrode 2 and second electrode 3 is enhanced in comparison with the mass loading effects of the two vibratory regions in which the first electrode 2 and second electrode 3 are formed. Namely, assuming that the film thickness of the opposed third electrode 4 is uniform in the regions, in which the first electrode 2, second electrode 3, and fifth mass load element 20 are formed, the (ρ×h) of the fifth mass load element 5 is set so as to be equal or greater than each of the value of (ρ×h) of the first electrode 2 and that of (ρ×h) of the second electrode 3.

This dual mode filter makes use of two vibration modes, i.e a symmetric mode and a diagonal symmetric mode, whose predominant vibration is the fundamental wave of thickness-longitudinal vibration generated as a result of application of voltage between the first electrode 2, second electrode 3, and third electrode 4. To ensure the vibration, there has to be a common vibration-ensuring portion. Consequently, in the same manner as in FIG. 2 of the first embodiment, a cavity portion is formed in the substrate, with the cavity portion being adapted to cover the region, in which the first electrode 2, second electrode 3, and fifth mass load element 20 are formed. Although sacrificial etching, etching from the rear side of the substrate using microfabrication, and transfer processes, in which the piezoelectric thin film is adhered to another substrate, etc. can be used to form the cavity portion, the specific process that is selected has no practical influence on the effects of the present invention.

In the same manner as in FIG. 4 of the first embodiment, it is desirable that, furthermore, second mass load elements 14a, 14b be formed on the outside and in the planar direction of the first electrode 2 and second electrode 3 on the piezoelectric material layer 1, and that the energy of the two generated vibration modes be confined to the region in which the desired first electrode 2, the second electrode 3, and the fifth mass load element 20 are formed.

As explained above, in a manner similar to the principle of operation of the first embodiment, the dual mode piezoelectric filter of the present embodiment can obtain a filter characteristic exhibiting low losses and a smooth passband.

It should be noted that, in the same manner as in the dual mode piezoelectric filter of the first embodiment, instead of using a cavity portion, support and thickness-longitudinal vibration may be ensured by placing an acoustic mirror between the substrate and third electrode 4, as shown in FIG. 6.

Figure 11:
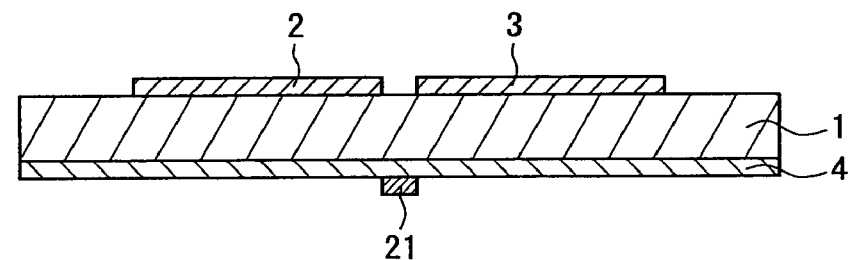
FIG. 11 is a cross-sectional view of another exemplary construction, in which a different material is used for the mass load element in the resonant portion of the same dual mode piezoelectric filter.

Furthermore, since the third electrode 4 is used as a grounding electrode, as shown in FIG. 11, the fifth mass load element 20 may be replaced with an electrically conductive sixth mass load element 21. The sixth mass load element 21 is formed from an electrically conductive material such as, for instance, aluminum (Al), gold (Au), molybdenum (Mo), platinum (Pt), titanium (Ti), tungsten (W), etc.

Figure 12:
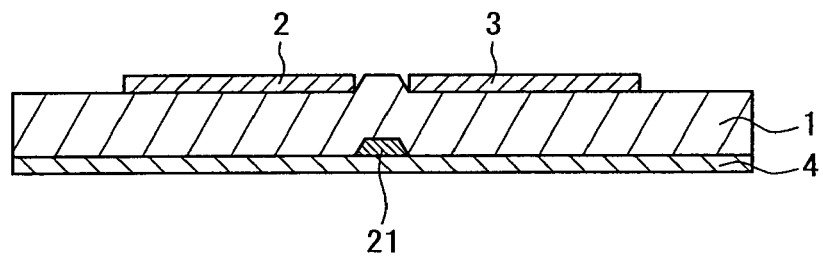
FIG. 12 is a cross-sectional view of another exemplary construction, in which the location of formation of the mass load element in the resonant portion of the same dual mode piezoelectric filter has been changed.

Furthermore, as shown in FIG. 12, instead of the insulating fifth mass load element 20 or electrically conductive sixth mass load element 21, a seventh mass load element 22 can be provided between the piezoelectric material layer 1 and third electrode 4 serving as a grounding electrode.

Furthermore, in the same manner as in the first embodiment, the fifth through seventh mass load element 20, 21, and 22 may be a multilayer structure of various insulating materials or insulating materials and electrically conductive materials.

Embodiment 3

Figure 13:
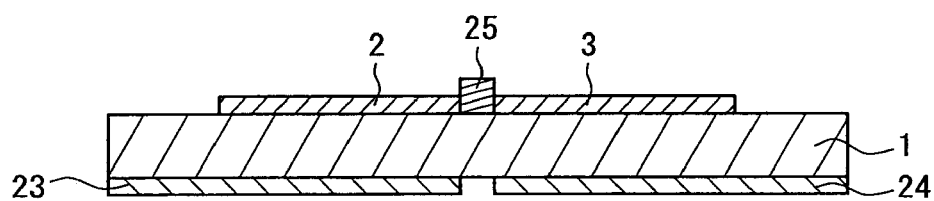
FIG. 13 is a cross-sectional view illustrating an exemplary construction of a resonant portion of a dual mode piezoelectric filter provided with four terminals according to a third embodiment of the present invention.

FIG. 13 is a cross-sectional view illustrating an exemplary construction of a resonant portion of a dual mode piezoelectric filter according to a third embodiment of the present invention.

In this resonant portion, a first electrode 2 and a second electrode 3 are formed on top of a high-cut type piezoelectric material layer 1, with a first gap provided therebetween, and a fourth electrode 23 and a fifth electrode 24 are formed on the other side of the piezoelectric material layer 1, also with a second gap provided between them. The first electrode 2 and fourth electrode 23, the second electrode 3 and fifth electrode 24, as well as the first gap and second gap, are arranged opposite to one another. Furthermore, an eighth mass load element 25 is formed in the first gap. Since the eighth mass load element 25 is made of an insulating material, the first electrode 2 and second electrode 3 are electrically insulated. Moreover, the fourth electrode 23 and fifth electrode 24 are spatially separated in the planar direction and, therefore, electrically insulated.

In the same manner as the construction of the first embodiment illustrated in FIG. 2, the construction of the resonant portion illustrated in FIG. 13 is formed on a substrate, with a cavity portion formed in the substrate, thus constituting the dual mode piezoelectric filter of the present embodiment. Furthermore, in the same manner as in the construction of the first embodiment illustrated in FIG. 3, a leadout wiring and a terminal electrode used by the first electrode 2, as well as a leadout wiring and a terminal electrode used by the second electrode 3, are formed on top of the piezoelectric material layer 1 and, moreover, a leadout wiring and a terminal electrode used by the fourth electrode 23, as well as a leadout wiring and a terminal electrode used by the fifth electrode 24, are formed on the substrate.

The first electrode 2, second electrode 3, fourth electrode 23, and fifth electrode 24 are formed from an electrically conductive material such as, for instance, aluminum (Al), gold (Au), molybdenum (Mo), platinum (Pt), titanium (Ti), tungsten (W), etc. The eighth mass load element 25 is formed from an insulating material such as, for instance, silicon oxide ($SiO_2$), silicon nitride (SiN), aluminum nitride (AlN), hafnium oxide ($HfO_2$), silicon (Si), etc. The piezoelectric material layer 1 is formed from a piezoelectric material possessing dispersion characteristics of the high-cut type, such as, e.g. aluminum nitride (AlN), PZT, etc.

In the same manner as in the first embodiment, a piezoelectric material possessing dispersion characteristics of the high-cut type is used for the piezoelectric material layer 1 and, in order to improve the coupling of the two generated vibration modes (symmetric mode and diagonal symmetric mode), the mass loading effect of the region between the first electrode 2 and second electrode 3 is enhanced in comparison with the mass loading effects of the two vibratory regions in which the first electrode 2 and second electrode 3 are formed.

In the present embodiment, the construction is such that the electrode corresponding to the third electrode 4 used in the dual mode piezoelectric filter of the first embodiment is divided into the fourth electrode 23 and fifth electrode 24 and there is no electrode in the region opposite to the eighth mass load element 25. Therefore, the relationship between, on the one hand, the value of ($\rho \times h$) of the eighth mass load element 25 and, on the other hand, the sum of the ($\rho \times h$) of the first electrode 2 and the ($\rho \times h$) of the fourth electrode 23, as well as the sum of the ($\rho \times h$) of the second electrode 3 and the ($\rho \times h$) of the fifth electrode 24, is set accordingly. Namely, the following relationships are satisfied, wherein h1 is the thickness and $\rho 1$ is the density of the first electrode 2, h2 is the thickness and $\rho 2$ is the density of the second electrode 3, h4 is the thickness and $\rho 4$ is the density of the fourth electrode 23, h5 is the thickness and $\rho 5$ is the density of the fifth electrode 24, and ha is the thickness and $\rho a$ is the density of the eighth mass load element 25.

$$(\rho 1 \times h1 + \rho 4 \times h4) \leq (\rho a \times ha), \text{ and}$$

$$(\rho 2 \times h2 + \rho 5 \times h5) \leq (\rho a \times ha).$$

This dual mode filter makes use of two vibration modes, i.e. a symmetric mode and a diagonal symmetric mode, whose predominant vibration is the fundamental wave of thickness-longitudinal vibration generated as a result of application of voltage between the first electrode 2 and fourth electrode 23 and between the second electrode 3 and fifth electrode 24. To ensure the vibration, there has to be a common vibration-ensuring portion. In the same manner as in FIG. 2 of the first embodiment, a cavity portion is formed in the substrate, with the cavity portion being adapted to cover the region in which the first electrode 2, second electrode 3, and eighth mass load element 25 are formed. Although sacrificial etching, etching from the rear side of the substrate using microfabrication, and transfer processes, in which the piezoelectric thin film is adhered to another substrate, etc. can be used to form the cavity portion, the specific process that is selected has no practical influence on the effects of the present invention.

In the same manner as in FIG. 4 of the first embodiment, it is desirable that, furthermore, second mass load elements 14a, 14b be formed on the outside and in the planar direction of the first electrode 2 and second electrode 3 on the piezoelectric material layer 1, and that the energy of the two generated vibration modes be confined to the region in which the desired first electrode 2, second electrode 3, and eighth mass load element 25 are formed.

As explained above, in a manner similar to the principle of operation of the first embodiment, the dual mode piezoelectric filter of the present embodiment can obtain a filter characteristic exhibiting low losses and a smooth passband.

It should be noted that, in the same manner as in the dual mode piezoelectric filter of the first embodiment, instead of using a cavity portion, support and thickness-longitudinal vibration may be ensured by placing an acoustic mirror between the substrate and the fourth electrode 23 and fifth electrode 24, as shown in FIG. 6.

Figure 14:
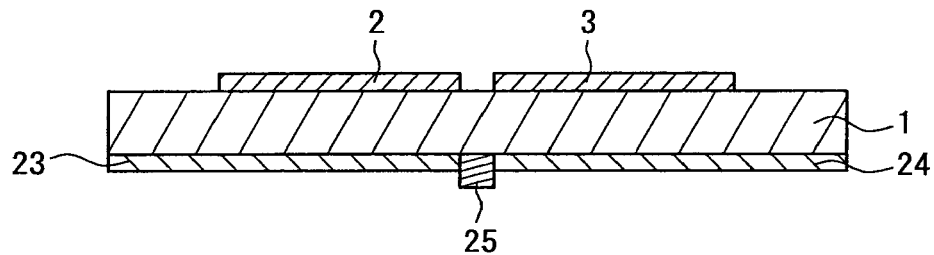
FIG. 14 is a cross-sectional view of another exemplary construction, in which the location of formation of the mass load element in the resonant portion of the same dual mode piezoelectric filter has been changed.

Moreover, as shown in FIG. 14, the eighth mass load element 25 may be formed in the second gap between the fourth electrode 23 and fifth electrode 24.

Furthermore, in the same manner as in the first embodiment, the eighth mass load element 25 may be a multilayer structure of various insulating materials or insulating materials and electrically conductive materials.

Moreover, a two-port filter can be formed by utilizing the first electrode 2 as an input (output) electrode, utilizing the second electrode 3 as an output (input) electrode, connecting the fourth electrode 23 and fifth electrode 24 in the other region shown in the figure and utilizing them as grounding electrodes.

Moreover, a four-port filter (balanced-balanced type filter) may be formed by utilizing the first electrode 2 as a first input (output) electrode, the second electrode 3 as a first output (input) electrode, the fourth electrode 23 as a second input (output) electrode, and the fifth electrode 24 as a second output (input) electrode.

Furthermore, a three-port filter (balanced-unbalanced type filter) may be formed by using any electrode among the first electrode 2, second electrode 3, fourth electrode 23, and fifth electrode 24 as a grounding electrode.

Embodiment 4

Figure 15A:
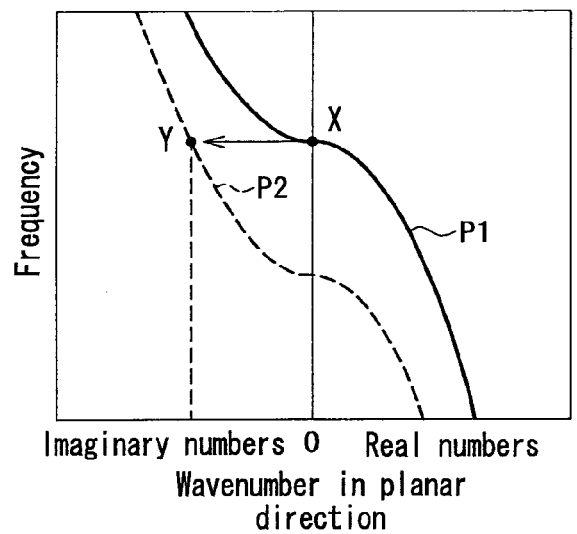
FIG. 15A is a diagram illustrating the dispersion characteristics of the vibratory portions used in the dual mode piezoelectric filter according to the fourth embodiment of the present invention.
Figure 15B:
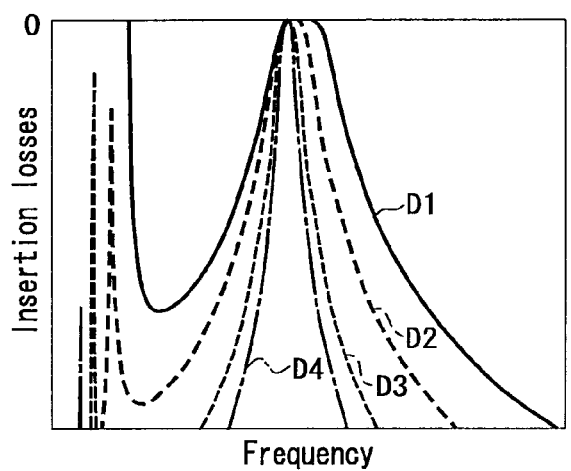
FIG. 15B is a diagram illustrating the filter characteristic of the same dual mode piezoelectric filter.
Figure 15C:
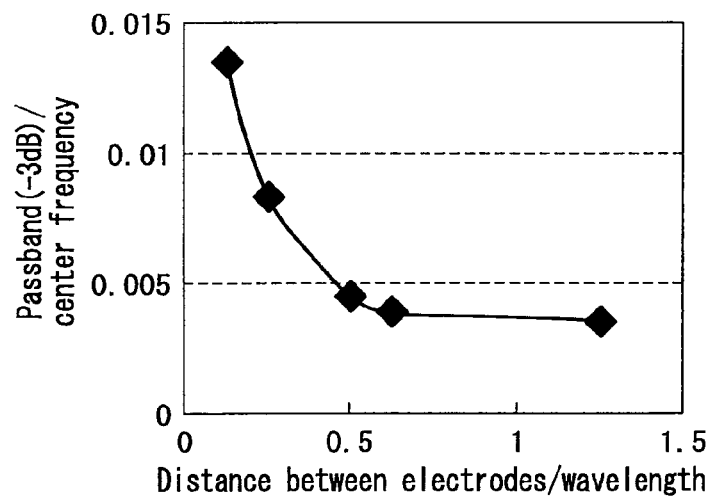
FIG. 15C is a diagram illustrating variation in passband of the same dual mode piezoelectric filter.

FIGS. 15A to 15C show the results of calculation when varying a length in a planar direction of the third vibratory region in the dual mode piezoelectric filters according to the first to third embodiments. The length in a planar direction of the third vibratory region is defined by a length of the gap between the first electrode 2 and the second electrode 3, that is a distance between the electrodes. Therefore the term "distance between the electrodes" is used in the following. Further, it should be noted that a planar direction of vibration corresponds to a direction of the distance between the electrodes. FIG. 15A shows dispersion characteristics, FIG. 15B shows filter characteristic, and FIG. 15C shows variation in passband as the length between the electrodes is varied.

In FIG. 15A, P1 shows dispersion characteristics of the first and second vibratory regions, and P2 shows dispersion characteristics of the third vibratory region. These dispersion characteristics are not affected by a length in a planar direction, so that the dispersion characteristics do not vary when the distance between the electrodes is varied. A point X indicates a resonant frequency of a thickness-longitudinal vibration in the first and second vibratory regions. A point Y indicates a wavenumber in the planar direction of a vibration generated in the third vibratory region at the frequency. Thus, a wavelength λy in the planar direction of a vibration generated in the third vibratory region at a passband frequency is represented by 2π/ky, where ky is a wavenumber at the point Y, because a passband of a filter generally is formed near the resonant frequency of the first and second vibratory regions.

In FIG. 15B, D1 to D4 show changes of filter characteristics (an insertion loss depending on a frequency) when varying a ratio of a distance between the electrodes with respect to the wavelength λy. D1 to D4 represent results for the ratios of 0.125λy, 0.25λy, 0.5λy, and 1.0λy, respectively. It is seen that a passband becomes narrower as a distance between the electrodes becomes larger. This is caused by decrease of a degree of coupling between the two generated modes.

In FIG. 15C, the abscissa indicates a value obtained by normalizing a distance between the electrodes with a wavelength, and the ordinate indicates a value obtained by normalizing a width (−3 dB) of a passband of a filter with a center frequency. Form this figure, it is seen that a width (−3 dB) of a passband of a filter becomes extremely small when a distance between the electrodes is 0.5λy or larger. Therefore it is preferable to make a distance between the electrodes smaller than 0.5λy, in order to obtain a filter having a sufficiently wide passband.

Embodiment 5

Figure 16:
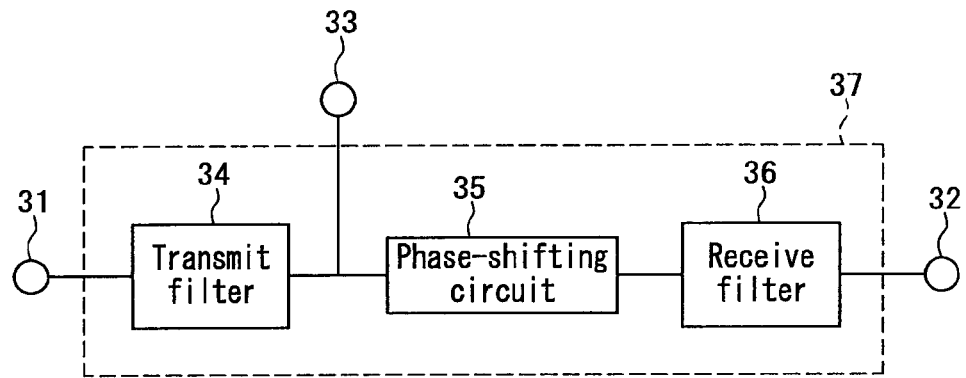
FIG. 16 is a block diagram illustrating an exemplary configuration of a duplexer provided with the dual mode piezoelectric filter of the present invention.

FIG. 16 shows a block diagram of an antenna duplexer as an example of a high-frequency circuit component according to the fifth embodiment of the present invention. The antenna duplexer 37 shown in the figure has a transmit terminal 31, a receive terminal 32, and an antenna terminal 33. A transmit filter 34, a phase-shifting circuit 35, and a receive filter 36 are arranged side-by-side between the transmit terminal 31 and receive terminal 32. The antenna terminal 33 is connected between the transmit filter 34 and phase-shifting circuit 35. At least one of the transmit filter 34 and receive filter 36 is equipped with a dual mode piezoelectric filter according to any of the above-described embodiments.

Figure 17:
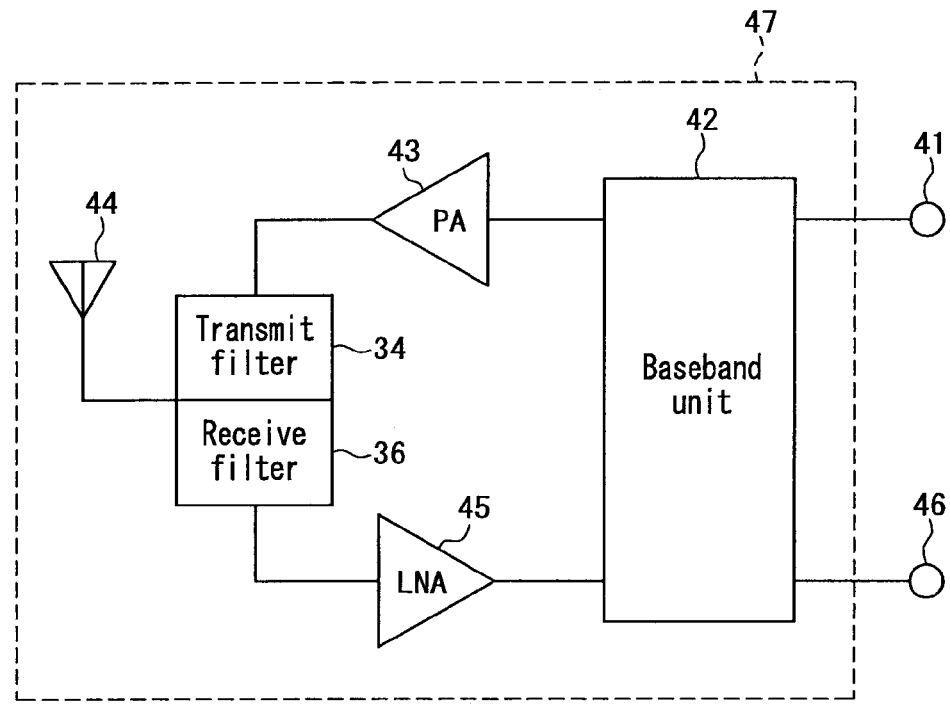
FIG. 17 is a block diagram illustrating an exemplary configuration of a communication device provided with the dual mode piezoelectric filter of the present invention.
Figure 18A:
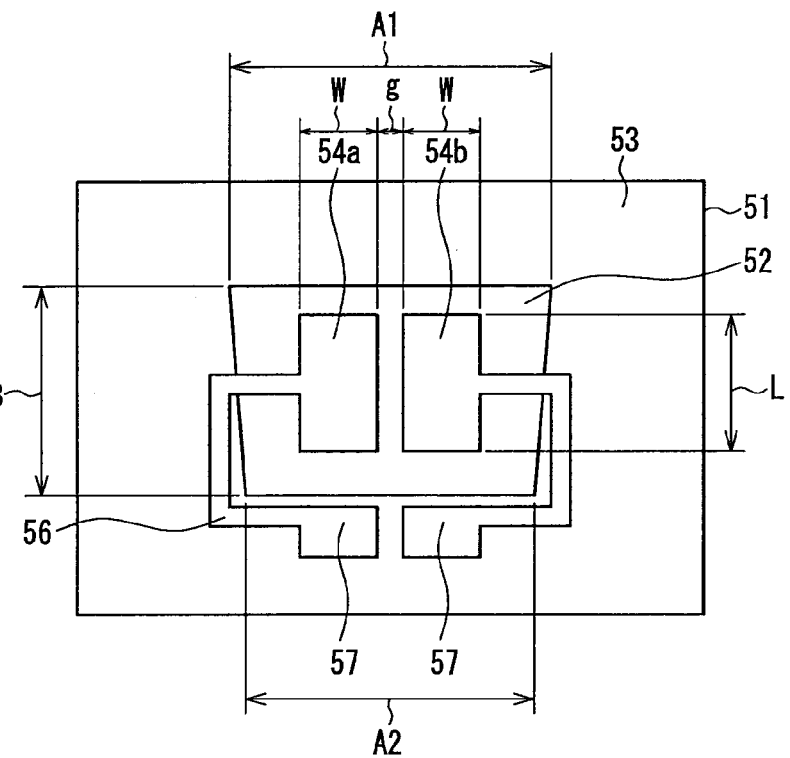
FIG. 18A is a top view illustrating an MCF (monolithic crystal filter) configuration utilizing a conventional dual mode.
Figure 18B:
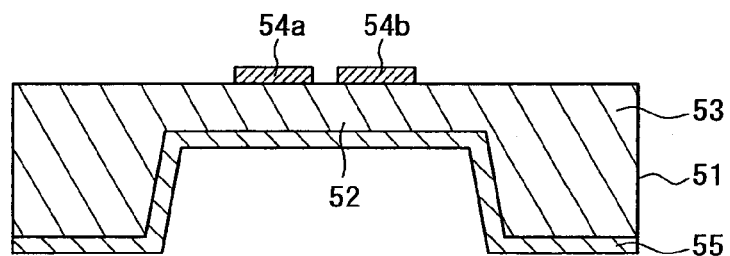
FIG. 18B is a cross-sectional view of the same MCF.
Figure 19:
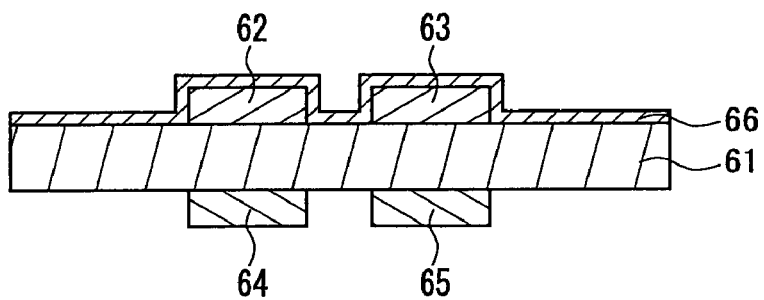
FIG. 19 is a cross-sectional view illustrating another MCF configuration utilizing a conventional dual mode.
Figure 20:
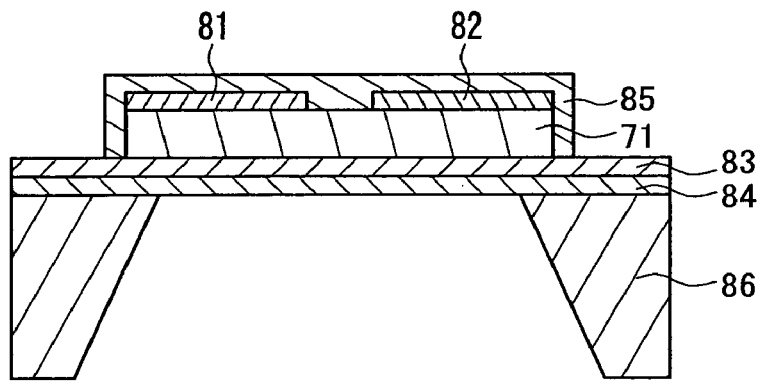
FIG. 20 is a cross-sectional view illustrating the configuration of a conventional dual mode piezoelectric filter utilizing a piezoelectric thin film of AlN.
Figure 21:
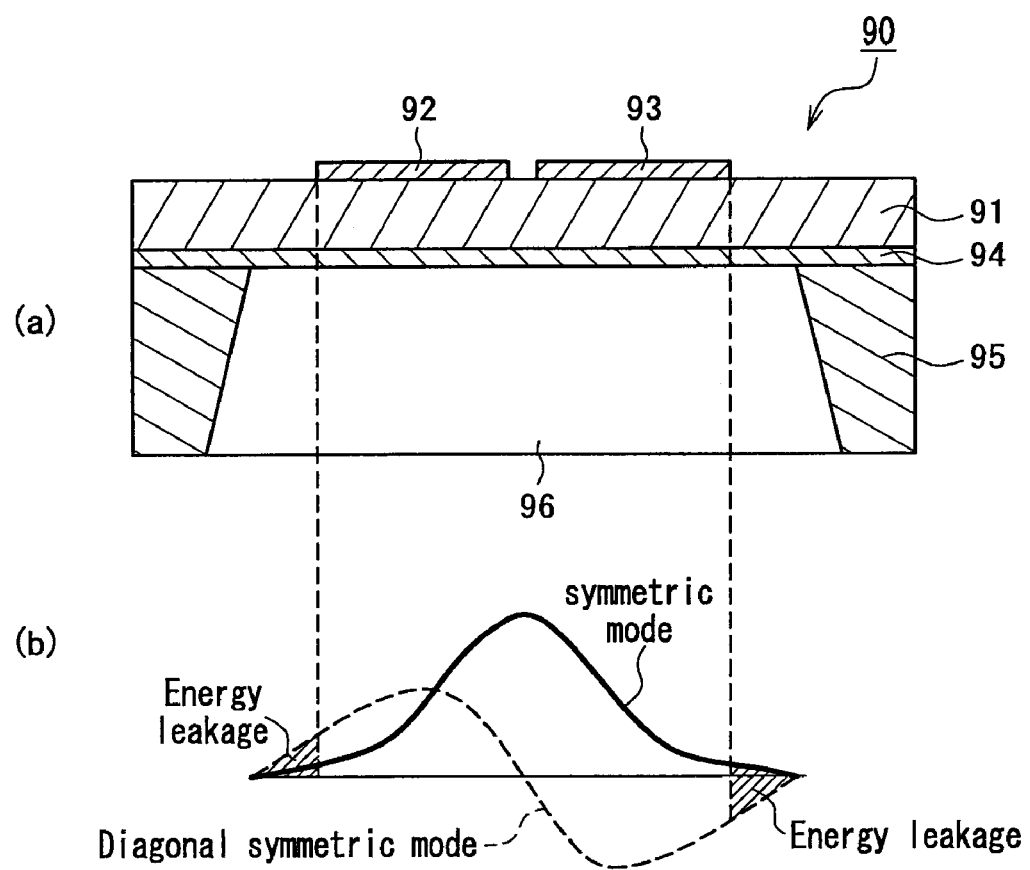
FIG. 21 is a diagram illustrating the vibrational distribution and configuration of a conventional dual mode piezoelectric filter utilizing a piezoelectric thin film of the high-cut type.
Figure 22A:
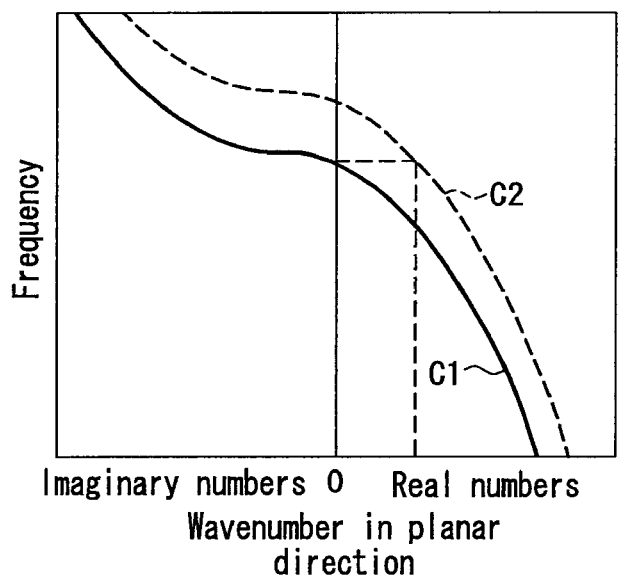
FIG. 22A is a diagram illustrating the dispersion characteristics of the vibratory portions in the same conventional dual mode piezoelectric filter.
Figure 22B:
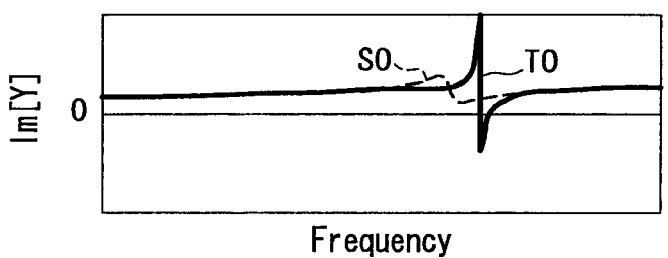
FIG. 22B is a diagram illustrating the admittance characteristics of the symmetric mode and diagonal symmetric mode in the same conventional dual mode piezoelectric filter.
Figure 22C:
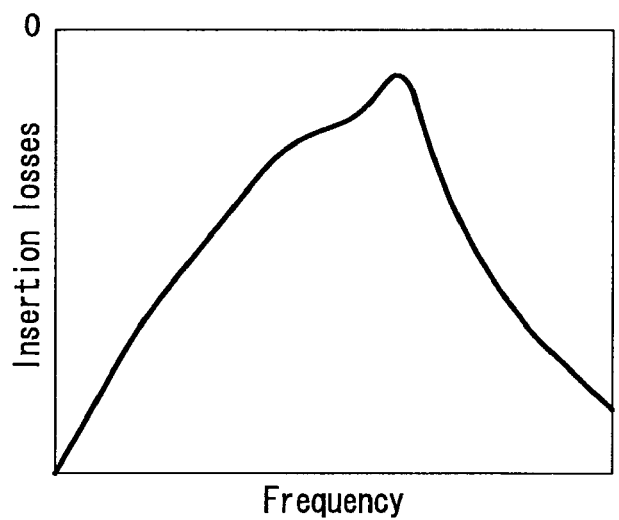
FIG. 22C is a diagram illustrating the filter characteristic of the same conventional dual mode piezoelectric filter.

Furthermore, as shown in FIG. 17, the dual mode piezoelectric filter according to the embodiments of the present invention can be utilized in a communication device, 47. In the communication device 47 shown in the figure, a signal appearing at the transmit terminal 41 passes through a baseband unit 42. Subsequently, the signal is amplified by a power amplifier 43 and filtered by passing through a transmit filter 34, and a radio signal is transmitted by the antenna 44. Moreover, a signal received from the antenna 44 is filtered by passing through a receive filter 36, is amplified by an LNA 45, passes through the baseband unit 42 and is supplied to the receive terminal 46. At least one of the transmit filter 34 and receive filter 36 is equipped with a dual mode piezoelectric filter according to any of the above-described embodiments.

As described above, the dual mode piezoelectric filter according to the present invention has a filter characteristic exhibiting low losses and a smooth bandpass and is useful in high frequency circuit components such as high frequency filters and couplers possessing low-loss characteristics, as well as in communication devices equipped with low-loss filters that provide superior voice transmission quality at low power consumption levels.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A dual mode piezoelectric filter comprising:
   a piezoelectric material layer composed of a piezoelectric thin film of the high-cut type formed on a substrate,
   a first electrode and a second electrode formed on one of the major surfaces of the piezoelectric material layer with a gap provided therebetween, and
   a third electrode formed on the other major surface of the piezoelectric material layer opposite to the first electrode, the second electrode, and the gap,
   wherein an interelectrode mass load element further is formed in the gap or at a position opposite to the gap on a surface of the piezoelectric material layer, and
   the relationships $(\rho_1 \times h_1) \leq (\rho_a \times h_a)$ and $(\rho_2 \times h_2) \leq (\rho_a \times h_a)$ are satisfied, where $\rho_1$ is the density and $h_1$ is the thickness of the first electrode, $\rho_2$ is the density and $h_2$ is the thickness of the second electrode, and $\rho_a$ is the density and $h_a$ is the thickness of the interelectrode mass load element.

2. The dual mode piezoelectric filter according to claim 1, wherein the interelectrode mass load element is formed on either one of the two major surfaces of the third electrode so as to be disposed at the position opposite to the gap.

3. The dual mode piezoelectric filter according to claim 1, wherein a resonant frequency fr3 is lower than each of resonant frequencies fr1 and fr2,
   where fr1 is the resonant frequency of a first vibratory region composed of the first electrode, third electrode, and piezoelectric material layer,
   fr2 is the resonant frequency of a second vibratory region composed of the second electrode, third electrode, and piezoelectric material layer, and
   fr3 is the resonant frequency of a third vibratory region composed of the interelectrode mass load element, third electrode, and piezoelectric material layer.

4. The dual mode piezoelectric filter according to claim 1, wherein the interelectrode mass load element comprises a layer made of an insulating material, and the first electrode and second electrode sandwiching the interelectrode mass load element are electrically insulated by the layer made of an insulating material.

5. The dual mode piezoelectric filter according to claim 4, wherein the interelectrode mass load element is composed of a multilayer film comprising the insulating material and an electrically conductive material, and the electrically conductive material is electrically insulated from the first electrode and second electrode by the insulating material.

6. The dual mode piezoelectric filter according to claim 4, wherein the insulating material is based on silicon oxide ($SiO_2$), silicon nitride (SiN), aluminum nitride (AlN), hafnium oxide ($HFO_2$), or silicon (Si).

7. The dual mode piezoelectric filter according to claim 1, wherein a distance between the first electrode and the second electrode, which form the gap, is smaller than a half of a wavelength λ of vibration generated in the gap.

8. The dual mode piezoelectric filter according to claim 1, wherein a cavity portion, or an acoustic mirror layer obtained by alternately depositing a low acoustic impedance layer and a high acoustic impedance layer, is formed below vibratory regions composed of the piezoelectric material layer, first electrode, second electrode, third electrode, and interelectrode mass load element.

9. The dual mode piezoelectric filter according to claim 1, wherein the piezoelectric material layer of the high-cut type is based on aluminum nitride (AlN) or PZT.

10. The dual mode piezoelectric filter according to claim 1, wherein on one of the major surfaces of the piezoelectric material layer, an external mass load element is formed outside a region of the first electrode and second electrode in a planar direction so as to enclose the first electrode and second electrode, and
the relationships $(\rho 1 \times h1) \leqq (\rho t \times ht)$ and $(\rho 2 \times h2) \leqq (\rho t \times ht)$ are satisfied, where $\rho t$ is the density and ht is the thickness of the external mass load element.

11. A high frequency circuit component comprising at least one dual mode piezoelectric filter, wherein the dual mode piezoelectric filter is the dual mode piezoelectric filter according to claim 1.

12. A communication device comprising an antenna, a transmit circuit, and a receive circuit, wherein a unit connecting the antenna to the transmit circuit or the receive circuit, or at least one of the transmit circuit and the receive circuit, comprises the high frequency circuit component according to claim 11.

13. A dual mode piezoelectric filter comprising:
a piezoelectric material layer composed of a piezoelectric thin film of the high-cut type formed on a substrate,
a first electrode and a second electrode formed on the other major surface of the piezoelectric material layer with a first gap provided therebetween, and
a fourth electrode and a fifth electrode formed on the other major surface of the piezoelectric material layer with a second gap provided therebetween,
so that the first electrode and the fourth electrode are arranged opposite to each other with the piezoelectric material layer interposed therebetween,
the second electrode and the fifth electrode are arranged opposite to each other with the piezoelectric material layer interposed therebetween, and
the first gap and the second gap are arranged opposite to each other with the piezoelectric material layer interposed therebetween,
wherein an interelectrode mass load element further is formed in the first gap or the second gap and
the relationships $(\rho 1 \times h1 + \rho 4 \times h4) \leqq (\rho a \times ha)$, and $(\rho 2 \times h2 + \rho 5 \times h5) \leqq (\rho a \times ha)$ are satisfied, where $\rho 1$ is the density and h1 is the thickness of the first electrode, $\rho 2$ is the density and h2 is the thickness of the second electrode, $\rho 4$ is the density and h4 is the thickness of the fourth electrode, $\rho 5$ is the density and h5 is the thickness of the fifth electrode, and $\rho a$ is the density and ha is the thickness of the interelectrode mass load element.

14. The dual mode piezoelectric filter according to claim 13,
wherein a resonant frequency fr3 is lower than each of resonant frequencies fr1 and fr2,
where fr1 is the resonant frequency of a first vibratory region composed of the first electrode, fourth electrode, and piezoelectric material layer,
fr2 is the resonant frequency of a second vibratory region composed of the second electrode, fifth electrode, and piezoelectric material layer, and
fr3 is the resonant frequency of a third vibratory region composed of the interelectrode mass load element and piezoelectric material layer.

15. The dual mode piezoelectric filter according to claim 13, wherein the interelectrode mass load element comprises a layer made of an insulating material, and the first electrode and second electrode, or the fourth electrode and fifth electrode, which have the interelectrode mass load element interposed therebetween, are electrically insulated by the layer made of an insulating material.

16. The dual mode piezoelectric filter according to claim 15, wherein the interelectrode mass load element is composed of a multilayer film comprising the insulating material and an electrically conductive material, and
the electrically conductive material is electrically insulated by the insulating material from the first electrode and second electrode, or from the fourth electrode and fifth electrode.

17. The dual mode piezoelectric filter according to claim 15, wherein the insulating material is based on silicon oxide ($SiO_2$), silicon nitride (SiN), aluminum nitride (AlN), hafnium oxide ($HFO_2$), or silicon (Si).

18. The dual mode piezoelectric filter according to claim 13, wherein a distance between the first electrode and the second electrode forming the gap is smaller than a half of a wavelength λ of vibration generated in the gap.

19. The dual mode piezoelectric filter according to claim 13, wherein a cavity portion, or an acoustic mirror layer obtained by alternately depositing a low acoustic impedance layer and a high acoustic impedance layer, is formed below vibratory regions composed of the piezoelectric layer, first electrode, second electrode, third electrode, and interelectrode mass load element.

20. The dual mode piezoelectric filter according to claim 13, wherein the piezoelectric material layer of the high-cut type is based on aluminum nitride (AlN) or PZT.

21. The dual mode piezoelectric filter according to claim 13,
wherein on one of the major surfaces of the piezoelectric material layer, an external mass load element is formed outside a region of the first electrode and second electrode in a planar direction so as to enclose the first electrode and second electrode, and
the relationships $(\rho 1 \times h1) \leqq (\rho t \times ht)$ and $(\rho 2 \times h2) \leqq (\rho t \times ht)$ are satisfied, where $\rho t$ is the density and ht is the thickness of the external mass load element.

22. A high frequency circuit component comprising at least one dual mode piezoelectric filter, wherein the dual mode piezoelectric filter is the dual mode piezoelectric filter according to claim 11.

23. A communication device comprising an antenna, a transmit circuit, and a receive circuit, wherein a unit connecting the antenna to the transmit circuit or the receive circuit, or at least one of the transmit circuit and the receive circuit, comprises the high frequency circuit component according to claim 22.

24. A method of manufacturing a dual mode piezoelectric filter comprising the steps of:
forming a first electrode and a second electrode on one of the major surfaces of a piezoelectric material layer composed of a high-cut type piezoelectric thin film with a gap provided therebetween, forming a third electrode on the other major surface of the piezoelectric material layer opposite to at least the first electrode and the second electrode, and forming an interelectrode mass load element in the gap or at a position opposite to the gap on a surface of the piezoelectric material layer, wherein values are set so as to satisfy the relationships $(\rho 1 \times h1) \leqq (\rho a \times ha)$ and $(\rho 2 \times h2) \leqq (\rho a \times ha)$, where $\rho 1$ is the density and $h1$ is the thickness of the first electrode, $\rho 2$ is the density and $h2$ is the thickness of the second electrode, and $\rho a$ is the density and $ha$ is the thickness of the interelectrode mass load element.

* * * * *